United States Patent [19]

Tanaka et al.

[11] Patent Number: 5,580,824

[45] Date of Patent: Dec. 3, 1996

[54] METHOD FOR FABRICATION OF INTERCONNECTIONS IN SEMICONDUCTOR DEVICES

[75] Inventors: Kimiaki Tanaka; Kouhei Eguchi, both of Kanagawa, Japan

[73] Assignee: Nippon Steel Corporation, Tokyo, Japan

[21] Appl. No.: 497,396

[22] Filed: Jun. 30, 1995

Related U.S. Application Data

[62] Division of Ser. No. 240,467, May 10, 1994, abandoned, which is a continuation of Ser. No. 887,010, May 22, 1992, abandoned.

[30] Foreign Application Priority Data

May 24, 1991 [JP] Japan ................... 3-149433

[51] Int. Cl.$^6$ ................................. H01L 21/283
[52] U.S. Cl. ................. 437/192; 437/194; 437/198
[58] Field of Search ................................ 437/189, 190, 437/192, 194, 198; 156/643.1, 659.11

[56] References Cited

U.S. PATENT DOCUMENTS

| | | | |
|---|---|---|---|
| 3,368,124 | 2/1968 | Ditrick | 257/766 |
| 4,541,169 | 9/1985 | Bartush | 437/189 |
| 4,695,869 | 9/1987 | Inoue et al. | 257/763 |
| 4,810,332 | 3/1989 | Pan | 204/15 |
| 4,843,453 | 6/1989 | Hooper et al. | 257/763 |
| 4,956,204 | 9/1990 | Amazawa et al. | 427/248.1 |
| 4,970,574 | 11/1990 | Tsunenari | 257/763 |
| 4,985,750 | 1/1991 | Hoshino | 257/762 |
| 4,990,994 | 2/1991 | Furukawa et al. | 257/766 |
| 5,019,531 | 5/1991 | Awaya et al. | 437/180 |
| 5,070,029 | 12/1991 | Pfiester et al. | 437/29 |

OTHER PUBLICATIONS

CVD Copper Metallurgy for ULSI Interconnections, Y. Arlta et al, NTT LSI Laboratories, 42 IEDM 90, pp. 3.1.1. to 3.1.4.

*Primary Examiner*—T. N. Quach
*Attorney, Agent, or Firm*—Cushman, Darby & Cushman, L.L.P.

[57] ABSTRACT

An interconnection pattern of a Cr film is defined by a wet-etching process by using fluoric acid and then a Cu film is grown over the surface of the Cr film. It is therefore not necessary to use a chloride gas when defining an interconnection pattern of a Cr film and when forming a Cu film. As a consequence, $CuCl_2$, which is a chloride, will not remain after the fabrication of an interconnection and corrosion of Cu and Cr films owing to the attachment of hydrochloric acid resulting from the reaction between a chloride and water. The present invention therefore can provide highly reliable and dependable interconnection structures for semiconductor devices and a method for fabrication thereof. The growth of Al on Cr is also shown.

2 Claims, 1 Drawing Sheet

METHOD FOR FABRICATION OF INTERCONNECTIONS IN SEMICONDUCTOR DEVICES

This is a division of application Ser. No. 08/240,467, filed May 10, 1994, abandoned which is a continuation of application Ser. No. 07/887,010, filed May 22, 1992 now abandoned.

BACKGROUND OF THE INVENTION

1. Field of the Invention

The present invention relates to structures of interconnections for electrically interconnecting elements and terminals of circuits in semiconductor devices and a method for the fabrication of such interconnection structures.

2. Description of the Related Art

Aluminum (Al) films have been widely used as interconnection films in semiconductor devices because their resistance is low, they can easily make ohmic contacts with silicon (Si), and they can make very intimate contact with insulating films such as $SiO_2$ films or the like. Aluminum films can also reliably prevent the occurrence of electromigration and stressmigration resulting from the increasing reduction in the width of interconnection films; the advantages of using copper (Cu) films as interconnection films have been reported in conferences and the like (for instance, Y. Arita et. al. "CVD COPPER METAL-LURGY FOR ULSI INTERCONNECTIONS". IEEE-IEDMECH. DIG.:pp 39–42).

Meanwhile, in the case of patterning interconnection film patterns and especially when defining an extreme interconnection film pattern, chlorine compound gases such as $Cl_2$ which can minimize undercuts, have been widely used in the dry etching process.

However, in the case of the dry etching process of Al and Cu films with HCl gas, chlorides such as $AlCl_3$, $CuCl_2$ and the like frequently tend to remain after dry etching. It follows therefore that these remaining chlorides react with water, producing hydrogen chloride. As a result, there arises a problem that the interconnection films are corroded within a short time. Thus, it has been impossible to fabricate highly reliable interconnection films by the above-described prior art methods.

The present invention, therefore, was made to overcome the problems encountered in the fabrication of interconnection films by the prior art fabrication methods and strives to provide highly reliable and dependable interconnection structures for semiconductor devices and a method for fabrication thereof.

SUMMARY OF THE INVENTION

In order to attain the above-described object, an interconnection film structure in accordance with the present invention is characterized by comprising a conductive film of an electrically conductive material that can be etched by a non-chloride compound and is formed over an insulating film and a copper film formed over said conductive film. The above-described structure is further characterized in that an electrically conductive material that is used to form said conductive film can be wet-etched. In addition, the major component of said conductive film is characterized by a compound selected from the group consisting of chromium (Cr), aluminum (Al), titanium (Ti) and titanium nitride (Tin). The major component of an electrically conductive material that forms said conductive film is characterized by a compound that can be dry-etched. The major component of said conductive film is characterized by a compound selected from the group consisting of a chromium (Cr), aluminum (Al), titanium (Ti), titanium nitride (TiN), tungsten (W) and polysilicon. Next, a method for the fabrication of an interconnection film for a semiconductor device in accordance with the present invention is characterized by a first step for forming a conductive film over an insulating film, a second step for forming an interconnection film pattern by etching said conductive film formed by said first step by using a non-chloride compound and a third step for carrying out the selective growth of an aluminum film or a copper film over the surface of said conductive film that was patterned in said second step. In this case, in the first step, said conductive film is formed by sputtering or vacuum evaporation and in the second step, patterning is accomplished by a wet etching process. The major component of said conductive film formed by the first step is a compound selected from the group consisting of chromium (Cr), aluminum (Al), titanium (Ti) and titanium nitride (TiN). In the second step, said interconnection film pattern is defined by a dry etching process. The major component of said conductive film formed in the first step is a compound selected from the group consisting of chromium (Cr), aluminum (Al), titanium (Ti), titanium nitride (TiN), tungsten (W) and polysilicon. Furthermore, a method for the fabrication of interconnection films for semiconductor devices in accordance with the present intention comprises the steps of defining an interconnection film pattern by etching a metal film with a non-chloride compound etching solution or gas and effecting the selective growth of an aluminum or copper film over said patterned metal film.

In the interconnection film structures for semiconductor devices and the methods for fabrication thereof in accordance with the present invention, in the case of forming an aluminum or copper interconnection film pattern, no etching gas consisting of a chloride is used so that the present invention has a characteristic feature in that any chlorides contained in interconnection film materials will not remain after the formation of interconnection films.

As described above, according to the present invention, any chloride compounds contained in interconnection-film materials will not remain after the formation of interconnection films so that corrosion of an interconnection film pattern owing to the attack of hydrogen chloride resulting from the reaction between chlorides and water will not occur and therefore the present invention can provide semiconductor devices with highly reliable and dependable interconnection structures.

DESCRIPTION OF THE PREFERRED EMBODIMENTS

Figure 1:
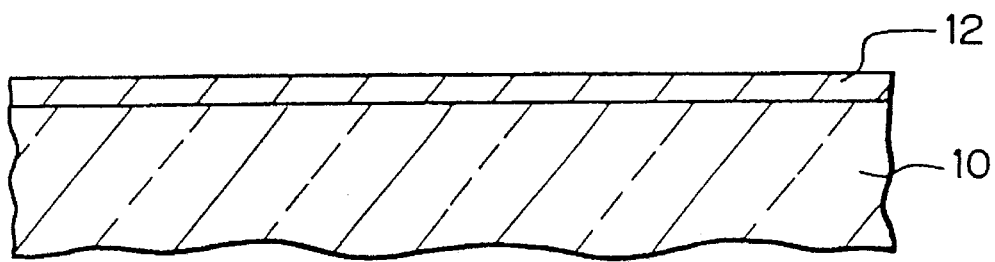
FIGS. 1(*a*), 1(*b*) and 1(*c*) are schematic sectional views used to explain the sequential fabrication steps of one embodiment of the present invention.
Figure 1:
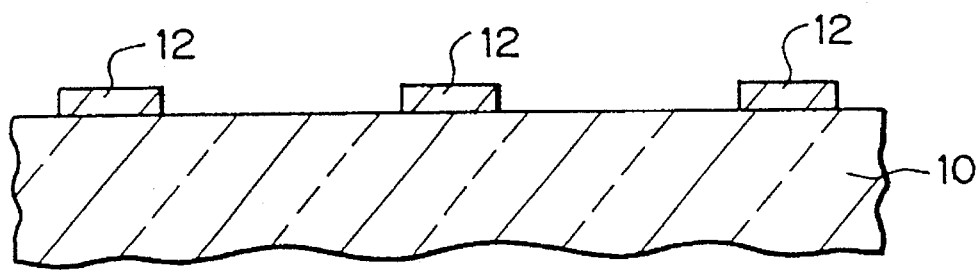
Figure 1:
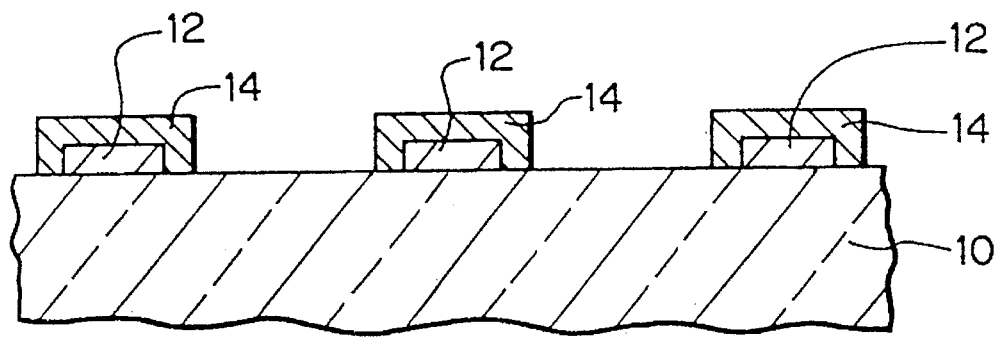

The present invention will become more apparent from the following description of the preferred embodiments thereof taken in conjunction with FIG. 1.

First, as shown in FIG. 1(*a*), a Cr film 12 about 2000 Å in thickness is formed over the whole surface of a $SiO_2$ film 10, which is a field oxide film or an insulating film interposed between the films by sputtering or vacuum evaporation. The insulating film 10 is formed over semiconductor elements that in turn are formed over the surface of a silicon semiconductor substrate or its silicon substrate.

Next a photoresist (not shown) is coated over the Cr film 12 and then patterned by a photolithographic process to define a desired interconnection pattern. Thereafter, the Cr film 12 masked with the above-described photoresist pattern is subjected to wet-etching by using fluoric acid.

Next the photoresist mask used in the wet-etching process is removed by $O_2$-plasma ashing techniques or the like. Then the Cr film 12 becomes a desired interconnection pattern as shown in FIG. 1(b).

Thereafter, while the substrate is maintained at about 30° C. and the total pressure is maintained at 2000 Pa, CVD is carried out by using, for instance, Cu(hfa)$_2$ as a material gas. Then, as shown in FIG. 1(c), a Cu film 14 is selectively grown over the surface of the Cr film 12, but is not grown over the $SiO_2$ film 10. Therefore, the interconnection pattern consisting of the Cu film 14, which is substantially similar to that of the Cr film 12, is defined.

As described above, it is to be noted that no chloride compound gas such as HCl gas is used to define the patter of the Cr film 12 and the Cu film 14. As a consequence, no chlorides of Cu and Cr will remain so that the corrosion problem of the Cu film 14 and the Cr film 12 owing to hydrochloric acid which is the reaction product of chlorides, such as described above, will not occur.

The thickness of the Cr film 12 is of the order of 2000 Å and is extremely narrow compared with the width of the interconnection pattern. In view of the above, according to the embodiment of the present invention, the pattern of the Cr films 12 is defined by wet etching. Owing to this process, the undercutting of the Cr film 12 can be minimized and its adverse effect on the interconnection pattern can be also reduced to a minimum.

So far it has been described that the Cr film 12 is patterned by wet etching techniques with fluoric acid, but it is to be understood that the patterning of the Cr film 12 can be carried out by dry etching techniques with a fluorine compound gas (for instance, $CF_4$). Furthermore, in the embodiment described above, it has been described that the Cu film 14 is grown over the surface of the Cr film 12, but it is also possible to grow an Al film instead of the Cu film 14 over the surface of the Cr film 12. In addition, according to the present invention, instead of the Cr film 12, any metal or an electrically conductive film upon which the Cu film or an aluminum (Al) film can be grown can be used. For instance, in the case of the dry etching process, Al film, W films, Ti films, Mo films, polysilicon films or the like can be used while in the case of the wet etching process, Al films, Ti films, TiN films or the like can be used instead of the Cr film 12.

We claim:

1. A method of fabricating an interconnection for a semiconductor device comprising:

(a) forming a chromium film over an insulating film;

(b) coating a photoresist over said chromium film;

(c) defining an interconnection pattern of said photoresist in accordance with a desired interconnection pattern;

(d) using fluoric acid to wet-etch said chromium film after defining said interconnection pattern;

(e) removing said photoresist; and (f) selectively depositing copper, by chemical vapor deposition, over upper and side surfaces of said etched chromium film.

2. A method of fabricating an interconnection for a semiconductor device comprising:

(a) forming a chromium film over an insulating film;

(b) coating a photoresist over said chromium film;

(c) defining an interconnection pattern of said photoresist in accordance with a desired interconnection pattern;

(d) using fluoric acid to wet-etch said chromium film;

(e) removing said photoresist; and (f) selectively depositing aluminum, by chemical vapor deposition, over upper and side surfaces of said etched chromium film.

* * * * *